United States Patent
Peng

(10) Patent No.: US 6,995,508 B2
(45) Date of Patent: Feb. 7, 2006

(54) ORGANIC ELECTROLUMINESCENT DEVICE WITH EFFICIENT HEAT DISSIPATION AND METHOD FOR MANUFACTURING THE SAME

(76) Inventor: Kuan-Chang Peng, No.8, LN 213, Sec. 2, Jingguo Rd., Hsinchu (TW) 300

( * ) Notice: Subject to any disclaimer, the term of this patent is extended or adjusted under 35 U.S.C. 154(b) by 89 days.

(21) Appl. No.: 10/618,671

(22) Filed: Jul. 15, 2003

(65) Prior Publication Data

US 2005/0012453 A1    Jan. 20, 2005

(51) Int. Cl.
*H05B 33/00* (2006.01)

(52) U.S. Cl. ............... 313/504; 313/506; 313/46
(58) Field of Classification Search ............... 313/504, 313/506, 512, 46; 428/690, 917; 315/169.3
See application file for complete search history.

(56) References Cited

U.S. PATENT DOCUMENTS

| | | | | |
|---|---|---|---|---|
| 4,895,734 A | * | 1/1990 | Yoshida et al. ............. 427/573 |
| 5,948,552 A | * | 9/1999 | Antoniadis et al. ......... 428/690 |
| 6,137,220 A | * | 10/2000 | Nagayama et al. ......... 313/504 |
| 6,320,311 B2 | * | 11/2001 | Nakaya et al. ............. 313/506 |
| 6,429,584 B2 | * | 8/2002 | Kubota ....................... 313/504 |

FOREIGN PATENT DOCUMENTS

JP    2002056986 A  *  2/2002

* cited by examiner

*Primary Examiner*—Karabi Guharay
(74) *Attorney, Agent, or Firm*—Rosenberg, Klein & Lee

(57) ABSTRACT

An organic electroluminescent (EL) device and a method for manufacturing the same are provided. The organic electroluminescent (EL) device comprises: a substrate; a plurality of first electrodes formed on the substrate, wherein each of a plurality of openings is formed between two of the first electrodes; a plurality of conductive heat-dissipation layers formed filling the openings, each of the conductive heat-dissipation layers contacting edge portions of two sides of the first electrodes; a plurality of organic layers formed of an organic EL material to cross the first electrodes partially; and at least a second electrode formed on the organic layers. The heat generated in the organic layer during operation dissipates out of the active region of the device and thus the device lifetime is prolonged and the reliability is improved.

4 Claims, 7 Drawing Sheets

ORGANIC ELECTROLUMINESCENT DEVICE WITH EFFICIENT HEAT DISSIPATION AND METHOD FOR MANUFACTURING THE SAME

BACKGROUND OF THE INVENTION

1. Field of the Invention

The present invention generally relates to an organic electroluminescent (to be abbreviated as "EL" hereinafter) device and a method for manufacturing the same and, more particularly, to an organic EL device with efficient heat dissipation employing an additional heat dissipation layer and a method.

2. Description of the Prior Art

The organic EL device has attracted tremendous attention due to its advantages over other display panels. These advantages include larger visual angle, shorter response time, smaller dimension in thickness, lower power consumption, simpler fabrication, no need for backlighting, and the ability for light emitting in a full color range.

Please refer to FIG. 1, which is a cross-sectional view showing the structure of a conventional organic EL device in accordance with the prior art. The organic EL device is characterized in that at least a first electrode 12 is formed on a substrate 11. On the first electrode 12, there is an organic layer 13 comprising at least an organic emitting layer, and a second electrode 14 formed by evaporation in turn. Then, a sealing cap layer 15 formed of resin is employed to protect the organic layer 13 from the external oxygen or the moisture.

Since, in an organic EL device, the light is generated when the electrons and holes from the first electrode 12 and second electrode 14 combine in the organic layer 13 to excite the organic emitting layer, it is inevitable that heat is generated during the luminescence process. Once the heat encounters the moisture existing inside the sealing cap layer 15, dark spots due to oxidation will be formed on the surface of the organic layer 13. The existence of such dark spots adversely affects the luminescence quality such as luminescence intensity and luminescence uniformity of an organic EL device. According to the so-called "10-degree rule", the lifetime of the device reduces to half for every 10-degree rise in operation temperature. Therefore, for a highly heat-generating device, the performance as well as the lifetime depends strongly on the ability in heat dissipation. More seriously, the lifetime of an organic EL device may be substantially shortened.

In order to overcome the image defects and shortened lifetime due to the disability in heat dissipation, the industry has developed a number of prior art organic EL displays, for example, in U.S. Pat. No. 5,948,552 "Heat-resistant organic electroluminescent device" filed by Antoniadis, et al. and U.S. Pat. No. 4,895,734 "Process for forming insulating film used in thin film electroluminescent device" filed by Yoshida, et al. However, in the aforementioned prior arts, additional materials are required with little concerns in structural reform. Little improvement in device performance is disclosed for organic EL devices.

Therefore, there is need in providing an organic EL device with efficient heat dissipation employing an additional heat dissipation layer and a method for manufacturing such a device so as to prolong the lifetime and improve the reliability.

SUMMARY OF THE INVENTION

Therefore, it is the primary object of the present invention to provide an organic EL device with efficient heat dissipation and a method for manufacturing such a device, characterized in that there are formed a plurality of openings by etching the first electrodes, wherein the openings are further filled with conductive heat-dissipation layers having excellent ability in electrical conductivity and heat dissipation such that the heat generated in the organic layer during operation dissipates out of the active region of the device and thus the device lifetime is prolonged and the reliability is improved.

It is another object of the present invention to provide an organic EL device with efficient heat dissipation and a method for manufacturing such a device, characterized in that structural reform of the first electrodes and the conductive heat-dissipation layers overcomes the problems related to the heat generated during operation and facilitates the development of the organic EL device.

It is still another object of the present invention to provide an organic EL device with efficient heat dissipation and a method for manufacturing such a device, characterized in that structural reform with a few more processing steps not only overcomes the problems related to the disability in heat dissipation but also reduces the manufacturing cost.

It is still another object of the present invention to provide an organic EL device with efficient heat dissipation and a method for manufacturing such a device, characterized in that the conductive heat-dissipation layers have better electric conductivity than the first electrodes such that the voltage drop across the first electrodes and the organic layers is uniformly reduced.

In order to achieve the foregoing objects, the present invention provides an organic EL device, comprising: a substrate; a plurality of first electrodes formed on the substrate, wherein each of a plurality of openings is formed between two of the first electrodes; a plurality of conductive heat-dissipation layers formed filling the openings, each of the conductive heat-dissipation layers contacting edge portions of two of the first electrodes; a plurality of organic layers formed of an organic EL material to cross the first electrodes partially; and at least a second electrode formed on the organic layers.

The present invention further provides a method for manufacturing an organic EL device, comprising steps of:
a. forming a first electrode on a substrate;
b. forming a plurality of openings by etching portions of the first electrode, whereby the first electrode turns into a plurality of first electrodes;
c. filling the openings with a plurality of conductive heat-dissipation layers consisting of a conductive heat-dissipation material with good electrical conductivity and heat dissipation, each of the conductive heat-dissipation layers contacting edge portions of two of the first electrodes;
d. forming a plurality of organic layers to cross the first electrodes partially uncovered by the conductive heat-dissipation layers; and
e. forming at least a second electrode on the organic layers.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic EL device with efficient heat dissipation employing an additional heat dissipation layer and a method for manufacturing such a device can be exemplified by the preferred embodiments as described hereinafter.

To start with, please refer to FIGS. 2A to 2E, which are cross-sectional views showing the processing steps of an organic EL device in accordance with one preferred embodiment of the present invention. As shown in the figures, the method for manufacturing an organic EL device comprises steps of.

Figure 1:
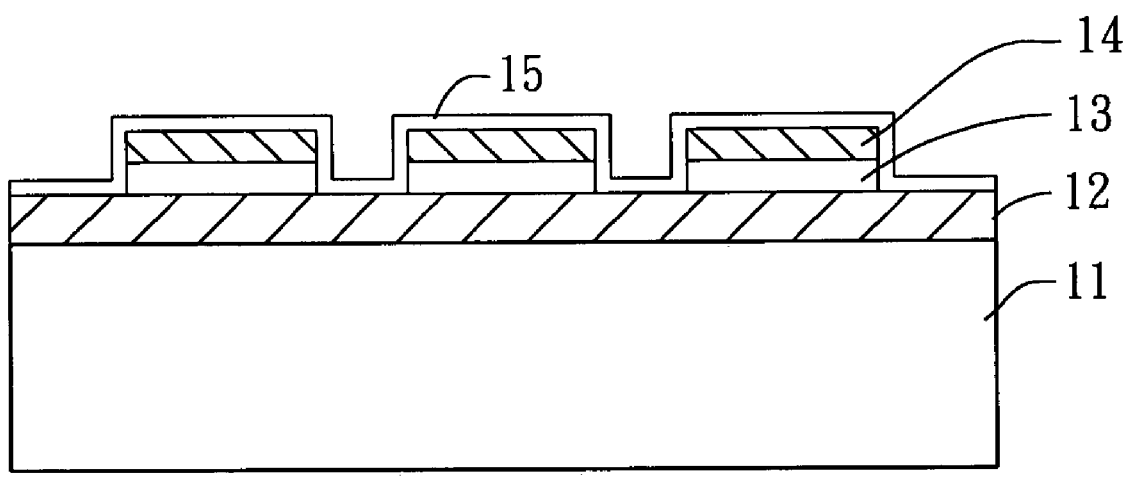
FIG. 1 is a cross-sectional view showing the structure of a conventional organic EL device in accordance with the prior art.
Figure 2A:
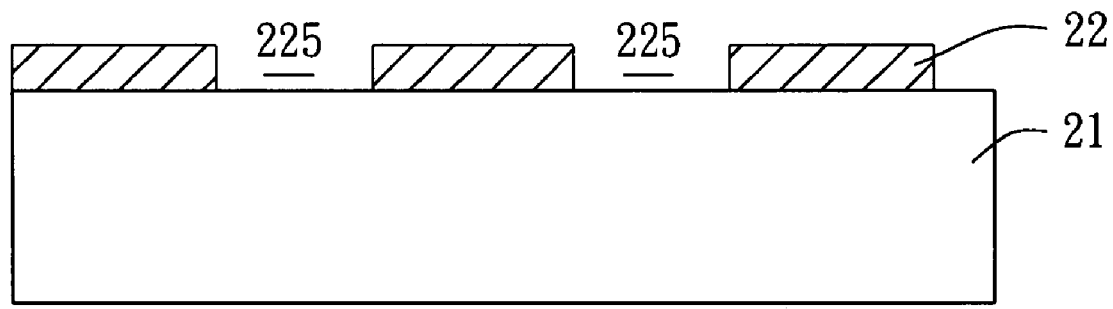
FIGS. 2A to 2E are cross-sectional views showing the processing steps of an organic EL device in accordance with one preferred embodiment of the present invention.

Step 1: A first electrode 22 is formed on a substrate 21. More particularly, the substrate 21 is a glass substrate. The first electrode 22 is formed of a transparent material such as indium-tin oxide (ITO). Moreover, a plurality of openings 225 are formed by etching portions of the first electrode, whereby the first electrode turns into a plurality of first electrodes, as shown in FIG. 2A.

Figure 2B:
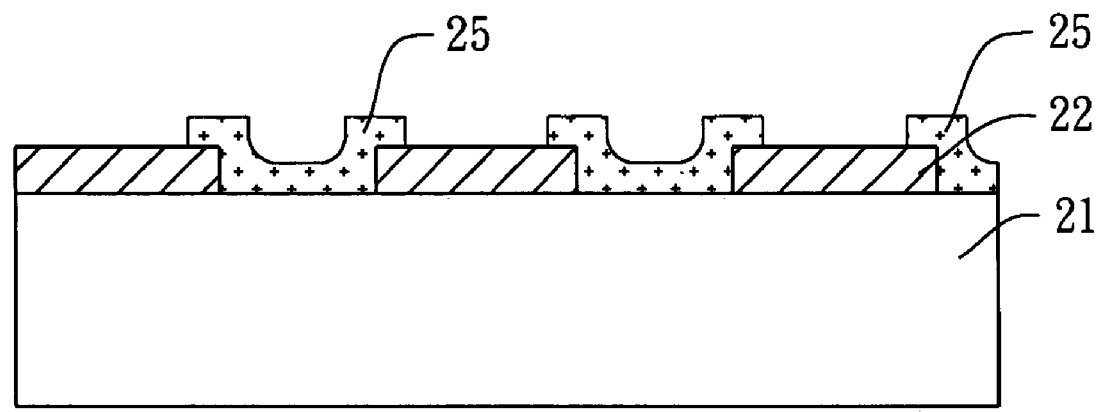

Step 2: A plurality of conductive heat-dissipation layers 25 consisting of a conductive heat-dissipation material with good electrical conductivity and heat dissipation are formed in the openings 225. Each of the conductive heat-dissipation layers contact edge portions of two of the first electrodes 22. In the preferred embodiment, each of the conductive heat-dissipation layers overlaps the edge portions of two of the first electrodes, as shown in FIG. 2B. Moreover, the conductive heat-dissipation layers 25 are formed a material with good electrical conductivity and heat dissipation, selected from a group consisting of Cu, Au, Ag, W, Mo, metallic compounds and nonmetallic compounds such as SiC.

Figure 2C:
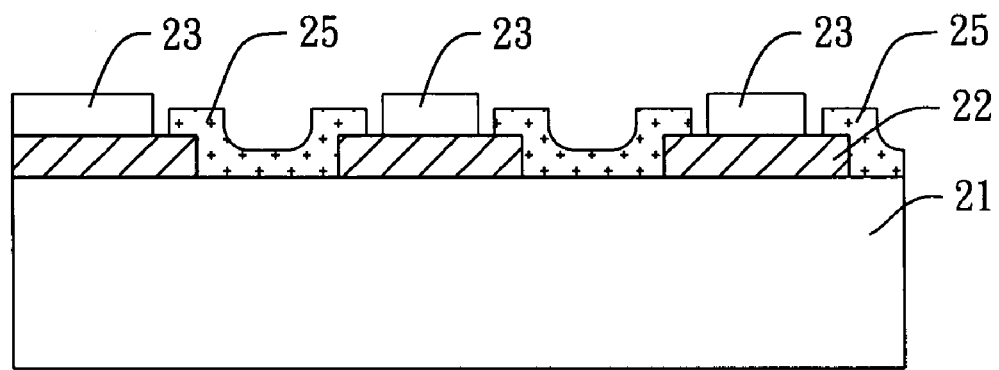

Step 3: A plurality of organic layers 23 comprising at least one of an organic hole transport layer, an organic emitting layer, an organic electron transport layer and combination thereof are formed by evaporation to partially cross the first electrodes 22 uncovered by the conductive heat-dissipation layers 25, as shown in FIG. 2C.

Figure 2D:
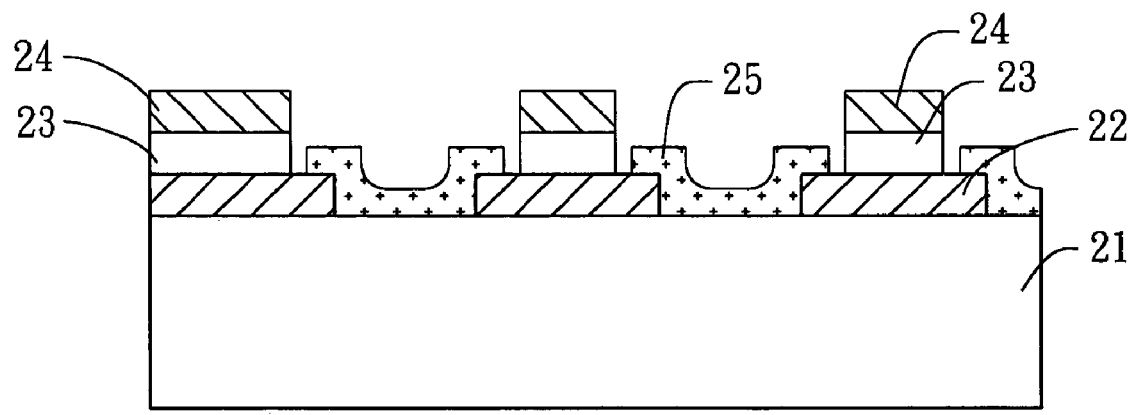

Step 4: A second electrode 24 is formed on the organic layers 23 such that the second electrode 24 electrically contact the first electrodes 22 through the organic layers 23, as shown in FIG. 2D.

Figure 2E:
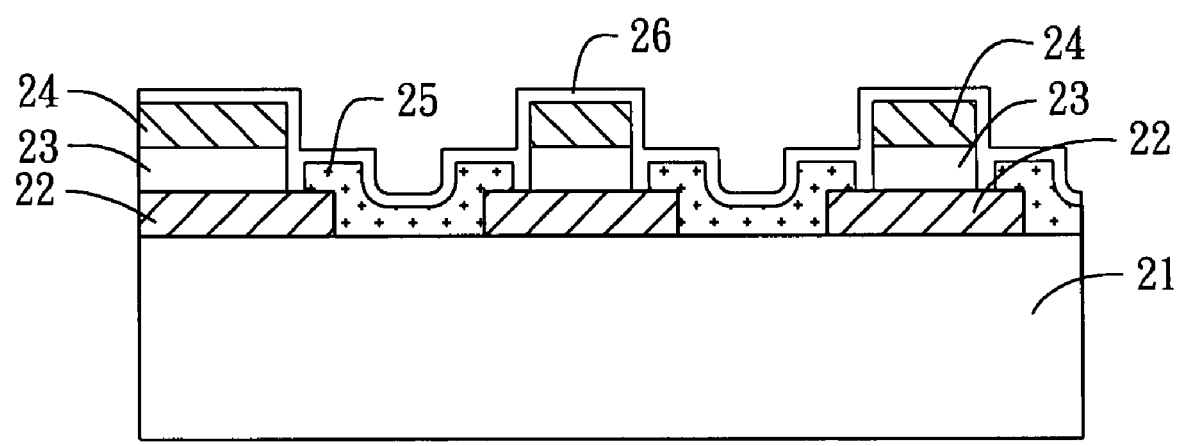

Step 5: Like conventional arts, a sealing cap layer 26 formed of resin is formed to cover the whole device so as to prevent the organic layer 23 from being oxidized, as shown in FIG. 2E.

In the present invention, the conductive heat-dissipation layers 25 contact the first electrodes 22, therefore the heat generated in the organic layers 23 when electricity conducts between the first electrodes 22 and the second electrodes 24 dissipates out of the active region through the conductive heat-dissipation layers 25. In other words, the ability in heat dissipation is improved by employing simple structural reform and processing steps. Certainly, the organic layers 23 are formed of one selected from a group consisting of an organic material for blue light emitting (B), an organic material for green light emitting (G), an organic material for red light emitting (R) and combination thereof.

Moreover, since the metallic material used for the conductive heat-dissipation layers 25 has better electrical conductivity than indium-tin oxide (ITO) used for the first electrodes, the voltage drop across the whole device is uniformly reduced that improves the performances of the organic EL device.

Figure 3:
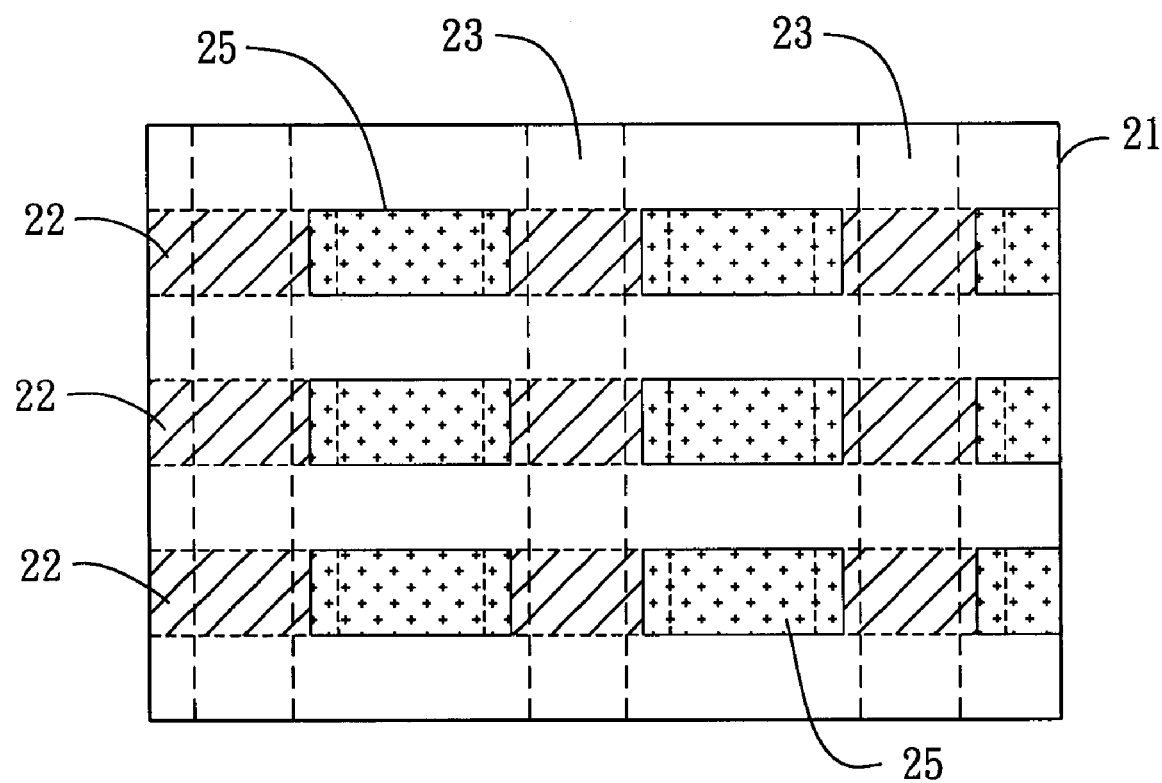
FIG. 3 is a top view showing the organic EL device in accordance with the preferred embodiment of the present invention.

Furthermore, please refer to FIG. 3, which top view showing the organic EL device in accordance with the preferred embodiment of the present invention. As shown in the figure, the first electrodes 22 (indicated by the oblique lines) cross the organic layers 23 (or the second electrodes) in the same manner as the prior art. However, the present invention is characterized in that there are a plurality of conductive heat-dissipation layers 25 (denoted by the spots) formed in the first electrodes 22 so as to replace some of the first electrodes 22. In order to ensure that each of the conductive heat-dissipation layers 25 contacts the edge portions of two of the first electrodes 22, the conductive heat-dissipation layers 25 partially cover the edge portions of two of the first electrodes 22 (the areas that have both oblique lines and spots). Therefore, the heat generated in the active region can be exhausted through the conductive heat-dissipation layers 25, without affecting the first electrodes 22.

Figure 4:
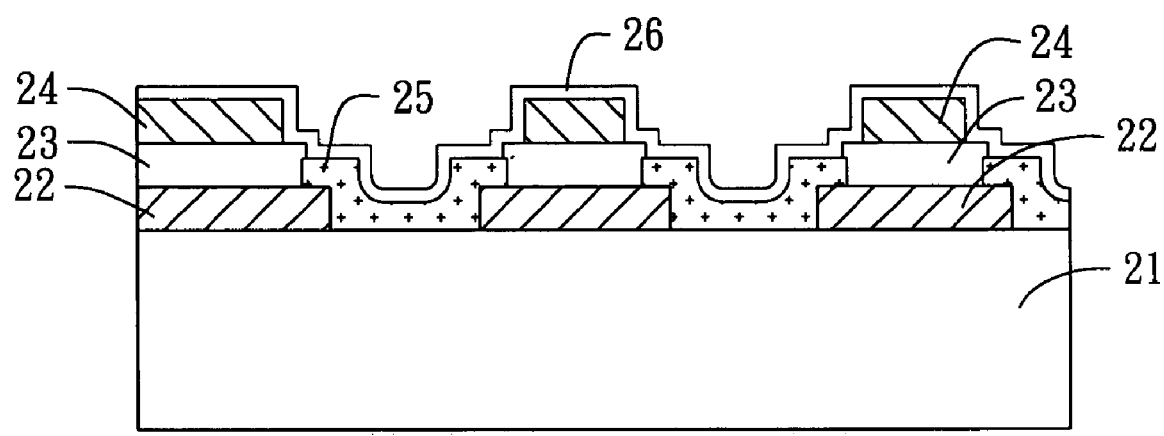
FIG. 4 is a cross-sectional view showing the structure of an organic EL device in accordance with another embodiment of the present invention.

Moreover, please refer to FIG. 4, which a cross-sectional view showing the structure of an organic EL device in accordance with another embodiment of the present invention. As shown in the figure, in order to ensure the isolation between the second electrode 24 from the first electrodes 22 so as to prevent the undesirable short circuit and crosstalk, the conductive heat-dissipation layers 25 cover more areas of the first electrodes 22 or the organic layers 23 expands through a larger area. As shown in the present embodiment, the organic layers 23 are formed across the edge portions of the conductive heat-dissipation layers 25 so as to improve the reliability of the organic EL device.

On the other hand, the present embodiment is characterized in that the conductive heat-dissipation layers are fabricated in various ways. In addition to the processing steps described with reference to FIG. 2, the organic EL device can be manufactured by using the steps of:

Step 1. A plurality of first electrodes 22, a plurality of organic layers 23, at least a second electrode 24 are formed conventionally in turn on the substrate 21.

Step 2. The first electrodes 22 uncovered by the organic layers 23 are etched to form a plurality of openings 225.

Step 3. By evaporation, the openings 225 are filled with a plurality of conductive heat-dissipation layers 25 having good electrical conductivity and heat dissipation, wherein each of the conductive heat-dissipation layers 25 contacts the edge portions of two of the first electrodes 22.

Figure 5:
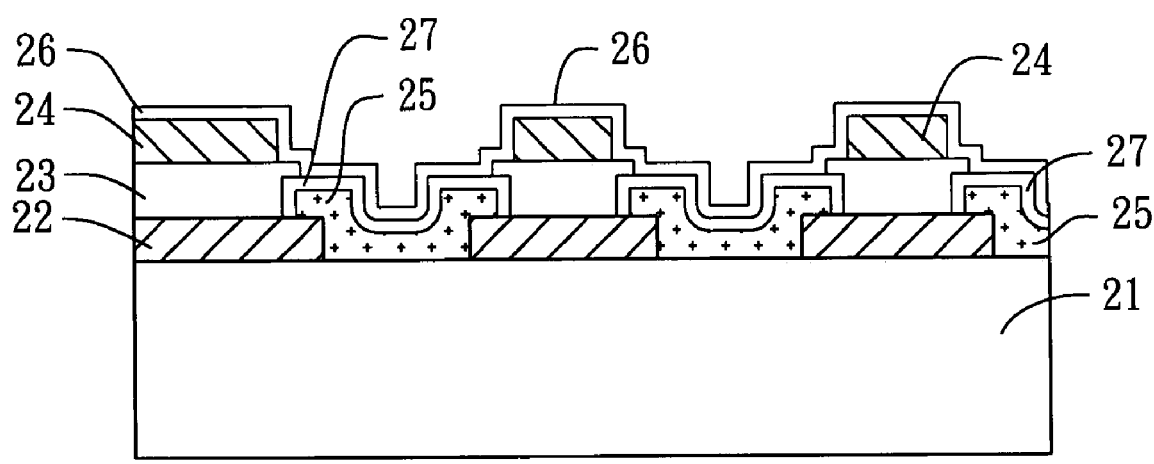
FIG. 5 is a cross-sectional view showing the structure of an organic EL device in accordance with still another embodiment of the present invention.

Furthermore, please refer to FIG. 5, which is a cross-sectional view showing the structure of an organic EL device in accordance with still another embodiment of the present invention. As shown in the figure, a dielectric insulating layer 27 is formed on the first electrodes 22 and the conductive heat-dissipation layers 25. The dielectric insulating layer 27 on each of the first electrodes 22 are removing by etching, remaining the dielectric insulating layer 27 on each of the conductive heat-dissipation layers 25. Certainly, with the use of the dielectric insulating layer 27, the undesirable crosstalk between the first electrodes 22 and the second electrode 24 can be prevented, and the light-emitting uniformity is improved owing to the confined current path.

According to the above discussion, the present invention discloses an organic EL device with efficient heat dissipation employing an additional heat dissipation layer and a method for manufacturing such a device, characterized in that the heat generated in the organic layer during operation dissipates out of the active region of the device and thus the device lifetime is prolonged and the reliability is improved. Therefore, the present invention has been examined to be novel, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescent (EL) device with efficient heat dissipation, comprising: a substrate; a plurality of first electrodes formed on said substrate, wherein each of a plurality of openings is formed between two of said first electrodes; a plurality of electrically conductive heat-dissipation layers formed filling said openings, each of said conductive heat-dissipation layers contacting edge portions of two of said first electrodes; a plurality of organic layers formed of an organic EL material to cross said first electrodes partially; and at least a second electrode formed on said organic layers; wherein each of said organic layers overlaps edge portions of two sides of said conductive heat-dissipation layers.

2. The organic EL device as recited in claim 1, wherein each of said conductive heat-dissipation layers overlaps said edge portions of two sides of said first electrodes.

3. The organic EL device as recited in claim 1, wherein said conductive heat-dissipation layers are formed of a conductive heat-dissipation material with excellent electrical conductivity and heat dissipation.

4. The organic EL device as recited in claim 1, further comprising a dielectric insulating layer formed on each of said conductive heat-dissipation layers.

* * * * *